United States Patent
Gekinozu et al.

(10) Patent No.: US 9,705,407 B2
(45) Date of Patent: Jul. 11, 2017

(54) POWER CONVERSION DEVICE

(71) Applicant: FUJI ELECTRIC CO., LTD., Kawasaki (JP)

(72) Inventors: Masakazu Gekinozu, Nagano (JP); Shun Fukuchi, Mie (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/057,466

(22) Filed: Mar. 1, 2016

(65) Prior Publication Data
US 2017/0019029 A1   Jan. 19, 2017

(30) Foreign Application Priority Data
Jul. 15, 2015   (JP) ................. 2015-141069

(51) Int. Cl.
| | |
|---|---|
| *H05K 7/20* | (2006.01) |
| *H02M 3/335* | (2006.01) |
| *H05K 5/02* | (2006.01) |
| *H05K 1/02* | (2006.01) |
| *H02M 7/00* | (2006.01) |
| *H02M 7/219* | (2006.01) |
| *H02M 1/00* | (2006.01) |

(52) U.S. Cl.
CPC ....... *H02M 3/33507* (2013.01); *H02M 7/003* (2013.01); *H02M 7/219* (2013.01); *H05K 1/0203* (2013.01); *H05K 5/0247* (2013.01); *H05K 7/20418* (2013.01); *H05K 7/20436* (2013.01); *H02M 2001/007* (2013.01)

(58) Field of Classification Search
CPC .. H05K 7/2089; H05K 1/0203; H05K 5/0247; H05K 7/20418; H05K 7/20436; H01L 23/4093; H02M 3/33507; H02M 7/003; H02M 7/219; H02M 2001/007
See application file for complete search history.

(56) References Cited

U.S. PATENT DOCUMENTS

| | | | | |
|---|---|---|---|---|
| 8,094,455 B2 * | 1/2012 | Hong-Chi | ............ | H01R 12/716 174/16.1 |
| 2004/0218367 A1 * | 11/2004 | Lin | ........................ | H05K 1/144 361/721 |
| 2009/0244852 A1 * | 10/2009 | Okada | ................... | H01L 23/433 361/721 |

FOREIGN PATENT DOCUMENTS

JP   5093481   9/2012

* cited by examiner

*Primary Examiner* — Robert J Hoffberg
*Assistant Examiner* — Hung Dang

(57) ABSTRACT

A power conversion device including: a chassis in which a heat sink is housed, and within which an upper space above the heat sink, a lower space below the heat sink, and a vertically continuous space that continues from a lower part to an upper part of the chassis are formed; a first substrate arranged from the lower space to the vertically continuous space, in which heat of a component mounted on the first substrate is transferred to the heat sink; a second substrate arranged in the upper space, in which heat of a component mounted on the second substrate is transferred to the heat sink; a wiring connecting the first substrate to the second substrate and passing through the vertically continuous space; and a tall electronic component taller than heights of the upper and lower spaces, that is mounted on the first substrate and arranged in the vertically continuous space.

9 Claims, 3 Drawing Sheets

POWER CONVERSION DEVICE

CROSS-REFERENCE TO RELATED APPLICATIONS

This application is based upon and claims the benefit of priority of the prior Japanese Patent Application No. 2015-141069, filed on Jul. 15, 2015, the entire contents of which are incorporated herein by reference.

TECHNICAL FIELD

The present invention relates to a power conversion device in which a self-heating electronic component and a tall electronic component are mounted on a substrate housed in a chassis.

BACKGROUND ART

In a power conversion device such as an in-car AC/DC converter, a substrate on which a semiconductor switching element for power conversion is mounted is arranged in a chassis. The semiconductor switching element is a heat-generating element, and thus needs to be efficiently cooled.

PTL 1 describes a heat releasing structure in which a protruding part for heat conduction is integrally formed on an inner surface of a case made of a heat conductive resin, and a heat-generating element mounted on a substrate is directly in contact with the protruding part for heat conduction or the heat-generating element is in contact with the protruding part for heat conduction via a heat-releasing member, so that heat of the heat-generating element is released to the case through the protruding part for heat conduction and cooling of the heat-generating element is efficiently performed.

CITATION LIST

Patent Literature

PTL 1: JP Patent No. 5093481

SUMMARY OF INVENTION

Technical Problem

An in-car power conversion device needs to be downsized. However, in a power conversion device using the heat releasing structure of PTL 1, all electronic components including a heat-generating element are mounted on one substrate and a large-sized substrate needs to be used, and thus, it is difficult to downsize the power conversion device.

An embodiment of the present invention was made in view of the foregoing problem, and an object of the present invention is to provide a power conversion device capable of efficiently cooling a heat-generating electronic component while being downsized.

Solution to Problem

In order to achieve the object mentioned above, according to an aspect of the present invention, there is provided a power conversion device including: a heat sink; a chassis in which the heat sink is housed, and within which an upper space above the heat sink, a lower space below the heat sink, and a vertically continuous space that continues from a lower part of the chassis to an upper part of the chassis are formed, the heat sink being arranged outside the vertically continuous space; a first substrate arranged from the lower space to the vertically continuous space, in which heat of a first heat-generating electronic component mounted on the first substrate is transferred to the heat sink; a second substrate arranged in the upper space, in which heat of a second heat-generating electronic component mounted on the second substrate is transferred to the heat sink; a wiring configured to electrically connect the first substrate to the second substrate, the wiring being arranged to pass through the vertically continuous space; and a tall electronic component taller than a height of the upper space and a height of the lower space, the tall electronic component being mounted on the first substrate in a state of being arranged in the vertically continuous space.

Advantageous Effects of Invention

According to the power conversion device according to an embodiment of the present invention, since the heat of the first heat-generating electronic component mounted on the first substrate is transferred to the heat sink, and the heat of the second heat-generating electronic component mounted on the second substrate is transferred to the heat sink, the cooling efficiency can be increased.

In addition, since the first substrate and the second substrate are arranged to sandwich the heat sink from above and below, and the tall electronic component is arranged in the vertically continuous space having a large height in the vertical direction, in which the heat sink does not exist, a small-sized power conversion device whose housing volume is reduced can be provided.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENTS

Figure 1:
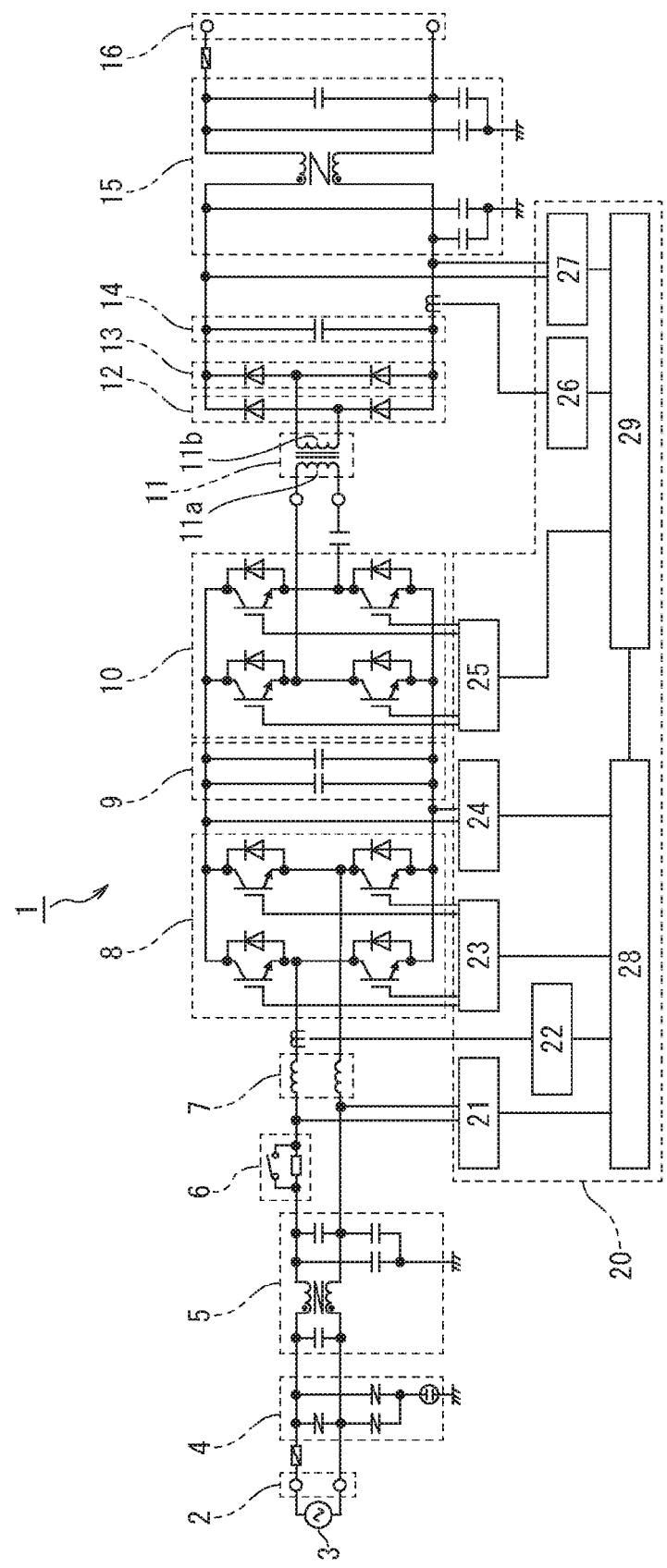
FIG. 1 is a circuit diagram illustrating a power conversion control unit of a power conversion device of a first embodiment according to the present invention.

Next, a first embodiment of the present invention will be described with reference to the drawings. In the following description of the drawings, the same or similar portions are denoted by the same or similar reference numerals. It is to be noted that the drawings are schematic and a relation between a thickness and a flat dimension, a ratio of thicknesses of respective layers, and the like are different from actual ones. Accordingly, specific thicknesses, dimensions, and the like should be determined with reference to the following description. In addition, it is certain that some portions have different dimensional relations and ratios between the drawings.

In addition, the following first embodiment illustrates devices and methods to embody the technical idea of the present invention, and the technical idea of the present invention does not limit the material, shape, structure, arrangement, and the like of a component to those described below. Various changes can be added to the technical idea of the present invention within the technical scope defined by claims.

Hereinafter, one embodiment of a power conversion device according to one mode of the present invention will be described with reference to the drawings appropriately.

FIG. 1 illustrates a power conversion control unit 1 that configures a power conversion device of the first embodiment, which is used as an AC/DC converter.

In the power conversion control unit 1, an AC power source 3 is connected to an AC input terminal 2. The AC input terminal 2 is connected to a primary winding 11*a* of a transformer 11 via a surge absorption circuit 4, a noise filter 5, an inrush prevention circuit 6, a reactor 7, a first semiconductor device 8, a bulk capacitor 9, and a second semiconductor device 10.

A secondary winding 11*b* of the transformer 11 is connected to a DC output terminal 16 via a first rectifier diode 12, a second rectifier diode 13, a smoothing capacitor 14, and a noise filter 15. A load is connected to the DC output terminal 16.

An integrated circuit 20 for power source control includes a first voltage detection circuit 21 that is connected between the inrush prevention circuit 6 and the reactor 7, a first current detection circuit 22 that is connected between the reactor 7 and the first semiconductor device 8, a first drive circuit 23 that is connected to the first semiconductor device 8, a second voltage detection circuit 24 that is connected between the first semiconductor device 8 and the bulk capacitor 9, a second drive circuit 25 that is connected to the second semiconductor device 10, a second current detection circuit 26 and a third voltage detection circuit 27 that are connected between the smoothing capacitor 14 and the noise filter 15, a first control circuit 28 configured to control the first voltage detection circuit 21, the first current detection circuit 22, the first drive circuit 23, and the second voltage detection circuit 24, and a second control circuit 29 configured to control the second drive circuit 25, the second current detection circuit 26, and the third voltage detection circuit 27.

Figure 2:
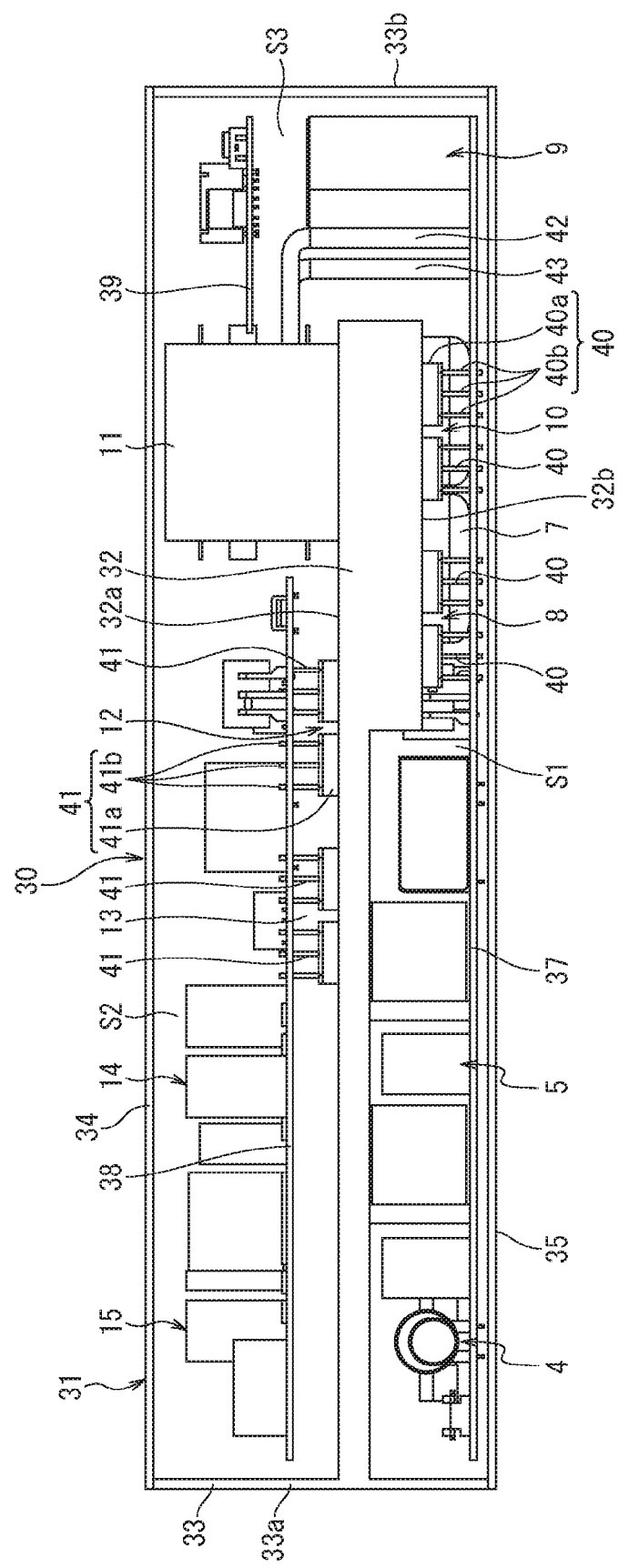
FIG. 2 is a side view illustrating an internal structure of the power conversion device of the first embodiment.

FIG. 2 illustrates an internal structure of a power conversion device 30 of the first embodiment.

In the power conversion device 30, a heat sink 32 is arranged within a rectangular parallelepiped-shaped chassis 31. The heat sink 32 extends from one end in the longitudinal direction to the middle on the other end side in the longitudinal direction.

The chassis 31 includes a rectangular parallelepiped-shaped case 33 that opens on the upper part and the lower part, an upper cover 34 that covers the upper opening of the case 33, and a lower cover 35 that covers the lower opening of the case.

The heat sink 32 is formed by die-casting aluminum or an aluminum alloy having high thermal conductivity, for example, and is formed to be connected to one side wall 33*a* of the case in the longitudinal direction and to extend toward the other side wall 33*b* with providing a space (vertically continuous space S3 described below) with the other side wall 33*b*.

The upper surface of the heat sink 32 is formed to be flat (hereinafter, referred to as cooling upper surface 32*a*), and furthermore, a cooling lower surface 32*b* close to the lower cover 35 is formed because the heat sink 32 is formed such that the dimension in the vertical direction on the side of the vertically continuous space S3 becomes larger.

Figure 3:
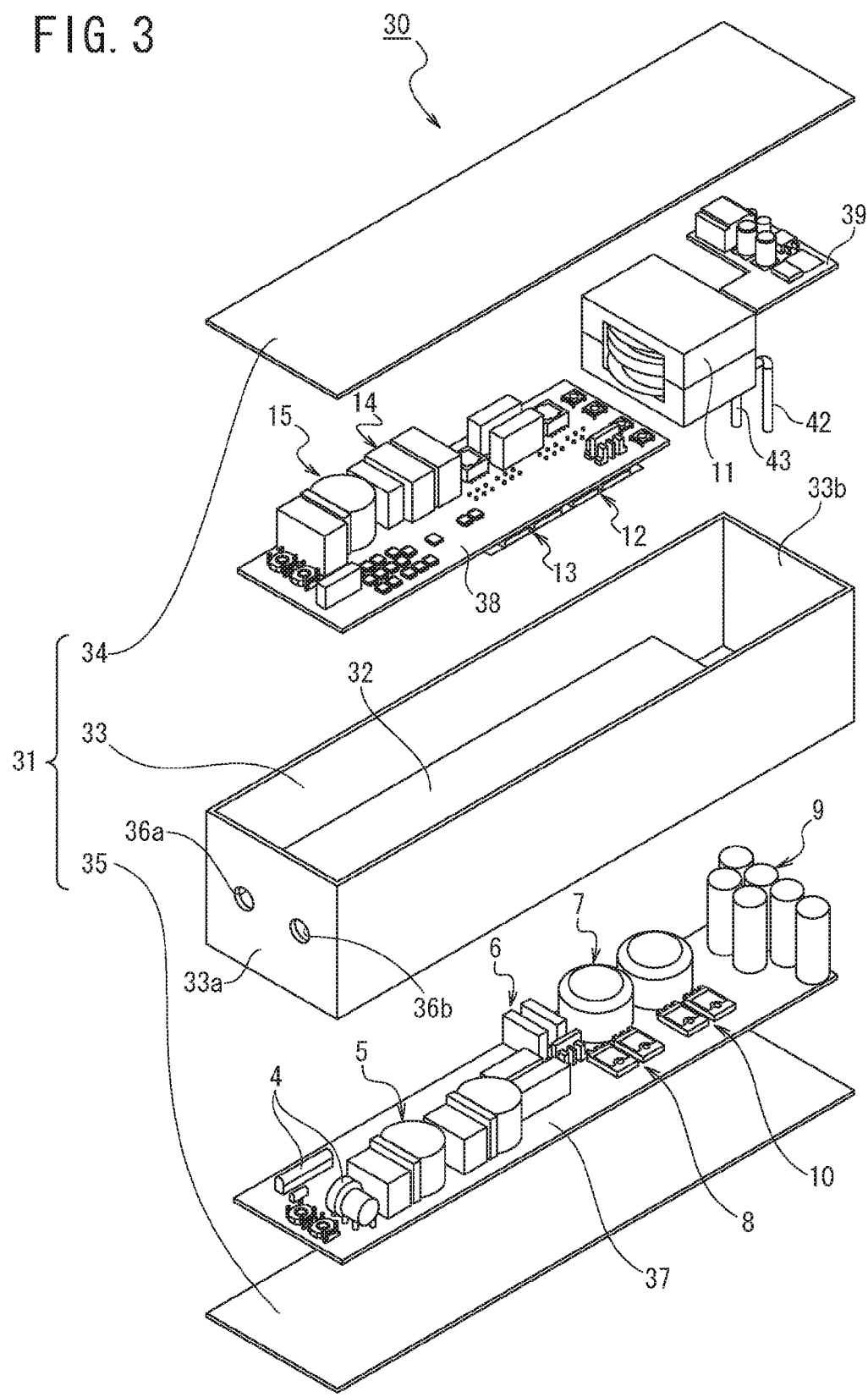
FIG. 3 is an exploded perspective view illustrating the internal structure of the power conversion device of the first embodiment.

A fluid circulating path (not illustrated in the drawing) is formed within the heat sink 32 such that a cooling fluid circulates within the heat sink 32. As illustrated in FIG. 3, on the one side wall 33*a*, a fluid supply opening 36*a* for supplying the cooling fluid to the fluid circulating path is formed, and a fluid discharge opening 36*b* for discharging the cooling fluid which has passed through the fluid circulating path to the outside is formed.

As illustrated in FIG. 2, a lower space S1 below the heat sink 32, an upper space S2 above the heat sink 32, and the above-described vertically continuous space S3 are provided within the chassis 31. The vertically continuous space S3, in which the heat sink 32 does not exist, continues from the lower part to the upper part of the inside of the chassis 31.

A first substrate 37 to a third substrate 39 on which the above-described electronic components and integrated circuit 20 that configure the power conversion control unit 1 are mounted are arranged in the lower space S1, the upper space S2, and the vertically continuous space S3.

The first substrate 37 is arranged from the lower space S1 to the vertically continuous space S3. As also illustrated in FIG. 3, the surge absorption circuit 4, the noise filter 5, the inrush prevention circuit 6, the reactor 7, the first semiconductor device 8, the bulk capacitor 9, and the second semiconductor device 10 of the power conversion control unit 1 are mounted on the first substrate 37.

As illustrated in FIG. 2, the second substrate 38 is arranged in the upper space S2. As illustrated in FIG. 3, the first rectifier diode 12, the second rectifier diode 13, the smoothing capacitor 14, and the noise filter 15 of the power conversion control unit 1 are mounted on the second substrate 38.

The transformer 11 of the power conversion control unit 1 is arranged in the upper space S2 in a state where the lower surface of the transformer 11 is in surface contact with the cooling upper surface 32*a* of the heat sink 32.

Each of the first semiconductor device 8 and the second semiconductor device 10 mounted on the first substrate 37 includes two semiconductor elements 40.

The semiconductor element 40 includes an element body 40*a* and a plurality of lead terminals 40*b* that extend downward from the element body 40*a* and are connected to the first substrate 37, and the element body 40*a* is fixed in a state of being in surface contact with the cooling lower surface 32*b* of the heat sink 32.

Each of the first rectifier diode 12 and the second rectifier diode 13 mounted on the second substrate 38 also includes two semiconductor elements 41.

The semiconductor element 41 includes an element body 41*a* and a plurality of lead terminals 41*b* that extend upward from the element body 41*a* and are connected to the second substrate 38, and the element body 41*a* is fixed in a state of being in surface contact with the cooling upper surface 32*a* of the heat sink 32.

In addition, the bulk capacitor 9 taller than the heights of the lower space S1 and the upper space S2 is mounted on the first substrate 37 in a state of being arranged in the vertically continuous space S3.

Wirings 42, 43 that electrically connect the first substrate 37 to the second substrate 38 are arranged to pass through the vertically continuous space S3.

Next, an operation and a cooling action of the power conversion device 30 of the first embodiment will be described.

In the power conversion device 30, when the integrated circuit 20 inputs a control signal to the power conversion control unit 1, commercial power inputted to the AC input terminal 2 is converted from AC to DC by the power conversion control unit 1 and is outputted from the DC output terminal 16 as DC power. At this time, the first and second semiconductor devices 8, 10, the transformer 11, and the first and second rectifier diodes 12, 13 of the power conversion control unit 1 generate heat.

When the cooling fluid supplied from the fluid supply opening 36a of the chassis 31 passes through the fluid circulating path and is discharged from the fluid discharge opening 36b, heat of the transformer 11 in contact with the cooling upper surface 32a of the heat sink 32 is transferred to the heat sink 32 to be released.

In addition, since the element bodies 40a of the semiconductor elements 40 that configure the first and second semiconductor devices 8, 10 are fixed in a state of being in surface contact with the cooling lower surface 32b of the heat sink 32, heat generated from the first and second semiconductor devices 8, 10 is also transferred to the heat sink 32 to be released.

Furthermore, since the element bodies 41a of the semiconductor elements 41 that configure the first and second rectifier diodes 12, 13 are fixed in a state of being in surface contact with the cooling upper surface 32a of the heat sink 32, heat generated from the first and second rectifier diodes 12, 13 is also transferred to the heat sink 32 to be released.

It is to be noted that a first heat-generating electronic component according to the present invention corresponds to the semiconductor element 40, a first element body according to the present invention corresponds to the element body 40a, a first lead terminal according to the present invention corresponds to the lead terminal 40b, a second heat-generating electronic component according to the present invention corresponds to the semiconductor element 41, a second element body according to the present invention corresponds to the element body 41a, a second lead terminal according to the present invention corresponds to the lead terminal 41b, and a tall electronic component according to the present invention corresponds to the bulk capacitor 9.

Next, effects of the first embodiment will be described.

In the power conversion device 30 of the first embodiment, when AC is converted to DC, the first and second semiconductor devices 8, 10, the transformer 11, and the first and second rectifier diodes 12, 13 generate heat. Since the transformer 11 and the element bodies 41a of the semiconductor elements 41 that configure the first and second rectifier diodes 12, 13 are fixed in a state of being in surface contact with the cooling upper surface 32a of the heat sink 32, and the element bodies 40a of the semiconductor elements 40 that configure the first and second semiconductor devices 8, 10 are fixed in a state of being in surface contact with the cooling lower surface 32b of the heat sink 32, the heat of the first and second semiconductor devices 8, 10, the transformer 11, and the first and second rectifier diodes 12, 13 is surely released to the heat sink 32, and the cooling efficiency can be sufficiently increased.

In addition, since the first substrate 37 and the second substrate 38 that configure the power conversion control unit 1 are arranged to sandwich the heat sink 32 from above and below, and the tall bulk capacitor 9 is arranged in the vertically continuous space S3 having a large height in the vertical direction, in which the heat sink 32 does not exist, the housing volume of the power conversion control unit 1 can be reduced, and the compact power conversion device 30 can be provided. Therefore, the power conversion device 30 can be downsized.

In addition, since the cooling lower surface 32b of the heat sink 32 is formed to be close to the lower cover 35, the cooling lower surface 32b and the first substrate 37 are close to each other. Since the cooling lower surface 32b and the first substrate 37 are close to each other, the semiconductor element 40 whose element body 40a is in surface contact with the cooling lower surface 32b does not need to extend the length of the lead terminal 40b, and the component cost can be reduced. Therefore, the manufacturing cost of the power conversion device 30 can be reduced.

In addition, since the wirings 42, 43 electrically connect the first substrate 37 to the second substrate 38 using the vertically continuous space S3, and a dedicated connector structure for connecting the first substrate 37 to the second substrate 38 becomes unnecessary, the manufacturing cost can be further reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

REFERENCE SIGNS LIST 1 power conversion control unit
2 AC input terminal
3 AC power source
4 surge absorption circuit
5 noise filter
6 inrush prevention circuit
7 reactor
8 first semiconductor device
9 bulk capacitor
10 second semiconductor device
11 transformer
11a primary winding
11b secondary winding
12 first rectifier diode
13 second rectifier diode
14 smoothing capacitor
15 noise filter
16 DC output terminal
20 integrated circuit
21 first voltage detection circuit
22 first current detection circuit
23 first drive circuit
24 second voltage detection circuit
25 second drive circuit
26 second current detection circuit
27 third voltage detection circuit
28 first control circuit
29 second control circuit
30 power conversion device
31 chassis
32 heat sink
32a cooling upper surface
32b cooling lower surface
33 case
34 upper cover
35 lower cover
36a fluid supply opening
36b fluid discharge opening 37 first substrate
38 second substrate
39 third substrate
40 semiconductor element
40a element body
40b lead terminal
41 semiconductor element
41a element body
41b lead terminal
42, 43 wiring
S1 lower space
S2 upper space
S3 vertically continuous space

The invention claimed is:

1. A power conversion device comprising:
    a heat sink;
    a chassis in which the heat sink is housed;
    an upper space above the heat sink, the upper space being formed within the chassis;
    a lower space below the heat sink, the lower space being formed within the chassis;
    a vertically continuous space that continues from a lower part of the chassis to an upper part of the chassis, the vertically continuous space being formed within the chassis, the heat sink being arranged outside of the vertically continuous space;
    a first substrate arranged from the lower space to the vertically continuous space, in which heat of a first heat-generating electronic component mounted on the first substrate is transferred to the heat sink;
    a second substrate arranged in the upper space, in which heat of a second heat-generating electronic component mounted on the second substrate is transferred to the heat sink;
    a wiring configured to electrically connect the first substrate to the second substrate, the wiring being arranged to pass through the vertically continuous space; and
    an electronic component taller than each of a height of the upper space and a height of the lower space, the electronic component being mounted on the first substrate in a state of being arranged in the vertically continuous space.

2. The power conversion device according to claim 1, wherein the first heat-generating electronic component includes a first element body that is fixed on a cooling lower surface of the heat sink in a surface contact state, and a first lead terminal that extends downward from the first element body and is connected to the first substrate.

3. The power conversion device according to claim 2, wherein the cooling lower surface of the heat sink is formed to be closer to the first substrate than another lower surface of the heat sink, the another lower surface being not in contact with the first element body.

4. The power conversion device according to claim 1, wherein the second heat-generating electronic component includes a second element body that is fixed on a cooling upper surface of the heat sink in a surface contact state, and a second lead terminal that extends upward from the second element body and is connected to the second substrate.

5. The power conversion device according to claim 4, wherein the cooling upper surface of the heat sink is formed to be closer to the second substrate than another upper surface of the heat sink, the another upper surface being not in contact which the second element body.

6. The power conversion device according to claim 2, wherein the second heat-generating electronic component includes a second element body that is fixed on a cooling upper surface of the heat sink in a surface contact state, and a second lead terminal that extends upward from the second element body and is connected to the second substrate.

7. The power conversion device according to claim 6, wherein the cooling upper surface of the heat sink is formed to be closer to the second substrate than another upper surface of the heat sink, the another upper surface being not in contact which the second element body.

8. The power conversion device according to claim 3, wherein the second heat-generating electronic component includes a second element body that is fixed on a cooling upper surface of the heat sink in a surface contact state, and a second lead terminal that extends upward from the second element body and is connected to the second substrate.

9. The power conversion device according to claim 8, wherein the cooling upper surface of the heat sink is formed to be closer to the second substrate than another upper surface of the heat sink, the another upper surface being not in contact which the second element body.

* * * * *